United States Patent
Choi et al.

(10) Patent No.: US 9,312,490 B2
(45) Date of Patent: Apr. 12, 2016

(54) PHOTOTHERMAL CONVERSION FILM HAVING GOOD VISIBLE LIGHT PENETRABILITY, AND TRANSFER FILM FOR OLED USING SAME

(71) Applicant: LG Hausys, Ltd., Seoul (KR)

(72) Inventors: Tae-Yi Choi, Gunpo-si (KR); Jang-Soon Kim, Seongnam-si (KR); Sang-Hwan Kim, Gunpo-si (KR); Myung-Hyun Jo, Incheon (KR); Dai-Hyun Kim, Seoul (KR)

(73) Assignee: LG HAUSYS, LTD., Seoul (KR)

( * ) Notice: Subject to any disclaimer, the term of this patent is extended or adjusted under 35 U.S.C. 154(b) by 0 days.

(21) Appl. No.: 14/413,601

(22) PCT Filed: Jun. 25, 2013

(86) PCT No.: PCT/KR2013/005601
§ 371 (c)(1),
(2) Date: Jan. 8, 2015

(87) PCT Pub. No.: WO2014/010845
PCT Pub. Date: Jan. 16, 2014

(65) Prior Publication Data
US 2015/0179939 A1 Jun. 25, 2015

(30) Foreign Application Priority Data
Jul. 13, 2012 (KR) ........................ 10-2012-0076921

(51) Int. Cl.
*H01L 51/00* (2006.01)
*H05B 33/22* (2006.01)
(Continued)

(52) U.S. Cl.
CPC .............. *H01L 51/003* (2013.01); *B32B 18/00* (2013.01); *C01G 41/006* (2013.01); *C01G 41/02* (2013.01);
(Continued)

(58) Field of Classification Search
CPC .................................................... H01L 51/5206
See application file for complete search history.

(56) References Cited

U.S. PATENT DOCUMENTS 6,074,802 A * 6/2000 Murata ................. B41C 1/1008
430/270.1
8,854,578 B2 * 10/2014 Yim ........................ G09G 3/32
313/504
(Continued)

FOREIGN PATENT DOCUMENTS

CN 101283627 A 10/2008
CN 102189864 A 9/2011
(Continued)

OTHER PUBLICATIONS
International Search Report for PCT/KR2013/005601 mailed on Sep. 24, 2013, citing the above reference(s).
(Continued)

*Primary Examiner* — Jerome Jackson, Jr.
*Assistant Examiner* — Ankush Singal
(74) *Attorney, Agent, or Firm* — Hauptman Ham, LLP

(57) ABSTRACT

Disclosed are a photothermal conversion film having good photothermal conversion effects and also good visible light penetrability, and a transfer film for an OLED using same. The photothermal conversion film according to the present invention comprises a base film and a photothermal conversion layer formed on the base film, wherein the photothermal conversion layer includes a tungsten oxide-based material and has visible light penetrability of 20% or greater.

16 Claims, 4 Drawing Sheets

(51) Int. Cl.
  *B32B 18/00* (2006.01)
  *C01G 41/00* (2006.01)
  *C01G 41/02* (2006.01)
  *H01L 51/50* (2006.01)

(52) U.S. Cl.
  CPC ........ *H01L 51/0013* (2013.01); *H01L 51/0096* (2013.01); *H05B 33/22* (2013.01); *B32B 2457/00* (2013.01); *H01L 51/5012* (2013.01); *Y02E 10/549* (2013.01); *Y10T 428/265* (2015.01)

(56) References Cited

U.S. PATENT DOCUMENTS

| | | | |
|---|---|---|---|
| 2006/0045962 A1* | 3/2006 | Miura | C23C 4/121 427/96.1 |
| 2006/0061267 A1* | 3/2006 | Yamasaki | H01L 51/0013 313/504 |
| 2007/0082288 A1 | 4/2007 | Wright et al. | |
| 2008/0014532 A1* | 1/2008 | Kessel | B24B 7/228 430/311 |
| 2008/0048562 A1* | 2/2008 | Matsuda | H01L 27/3244 313/506 |
| 2011/0143116 A1* | 6/2011 | Chung | B82Y 30/00 428/220 |
| 2011/0155238 A1* | 6/2011 | Shen | C07F 15/002 136/256 |
| 2011/0180203 A1* | 7/2011 | Sun | B41M 5/38221 156/247 |
| 2011/0207603 A1* | 8/2011 | Kawahara | B41M 5/305 503/201 |

FOREIGN PATENT DOCUMENTS

| | | |
|---|---|---|
| JP | 05330237 A | 12/1993 |
| JP | 08197860 A | 8/1996 |
| JP | 2007525011 A | 8/2007 |
| JP | 2009512143 A | 3/2009 |
| JP | 2011194883 A | 10/2011 |
| KR | 20110040244 A | 4/2011 |
| KR | 20110069708 A | 6/2011 |
| KR | 101121783 B1 | 3/2012 |
| KR | 20120131436 A | 12/2012 |

OTHER PUBLICATIONS

European Search Report dated Jul. 7, 2015 in connection with the counterpart European Patent Application No. 13816013.0, citing the above reference(s).

Japanese Office Action dated Dec. 4, 2015 in connection with the counterpart Japanese Patent Application No. 2015-521538, citing the above reference(s).

Chinese Office Action dated Jan. 4, 2016 in connection with the counterpart Chinese Patent Application No. 201380037472.8, citing the above reference(s).

* cited by examiner

PHOTOTHERMAL CONVERSION FILM HAVING GOOD VISIBLE LIGHT PENETRABILITY, AND TRANSFER FILM FOR OLED USING SAME

TECHNICAL FIELD

The present invention relates to a transfer film for organic light emitting diodes (OLEDs), and more particularly, to a transfer film for OLEDs, which can be easily aligned with a substrate due to excellent visible light transmittance thereof, thereby improving OLED productivity.

BACKGROUND ART

In displays, since organic light emitting diodes (OLEDs) have various merits, such as self-luminescence, high brightness, low response time and the like, as compared with liquid crystal displays (LCDs), many studies have focused on OLEDs.

OLEDs include an organic light emitting material. Typically, the organic light emitting material is applied by deposition. However, deposition has a problem of difficult formation of a uniform organic light emitting material layer.

Recently, thermal transfer is used in the art. In thermal transfer, when a transfer film includes a photothermal conversion layer and an organic light emitting material layer therein and is subjected to light irradiation using a laser or the like, a material included in the photothermal conversion layer absorbs light and emits heat, thereby transferring the organic light emitting material layer onto a substrate. Thermal transfer facilitates formation of the uniform organic light emitting material layer, as compared with deposition.

Typically, carbon black is used as a light-absorbing material for the photothermal conversion layer of the transfer film. Carbon black has difficulty in transmitting visible light and securing transparency of a film, thereby making it difficult to achieve accurate alignment of the transfer film with the substrate.

In the related art, Korean Patent Publication No. 10-2011-0069708 (publication date: Jun. 23, 2011) discloses a photothermal conversion sheet, an organic electroluminescent material sheet using the same, and a method of manufacturing an organic electroluminescent device.

DISCLOSURE

Technical Problem

It is one aspect of the present invention to provide a photothermal conversion film exhibiting excellent visible light transmittance.

It is another aspect of the present invention to provide a transfer film for OLEDs, which exhibits excellent visible light transmittance and thus is easily aligned with a substrate provided as a transfer target of an organic light emitting material.

Technical Solution

In accordance with one aspect of the present invention, a photothermal conversion film includes: a base film; and a photothermal conversion layer formed on the base film, wherein the photothermal conversion layer includes a tungsten oxide-based material and has a visible light transmittance of 20% or more.

Here, the tungsten oxide-based material may include tungsten oxide powder.

In addition, the tungsten oxide-based material may include alkali metal-containing tungsten oxide powder. In this case, the alkali metal may include at least one of potassium (K), rubidium (Rb), and cesium (Cs).

The photothermal conversion layer may include 10 parts by weight to 50 parts by weight of a binder and 0.1 parts by weight to 5 parts by weight of a photoinitiator, based on 100 parts by weight of the tungsten oxide-based material.

The photothermal conversion layer may have a thickness of 1 μm to 5 μm.

The photothermal conversion film may further include a protective layer formed on the photothermal conversion layer. In this case, the protective layer may have a thickness of 0.1 μm to 1.5 μm.

In accordance with another aspect of the present invention, a transfer film for OLEDs includes: a base film; a photothermal conversion layer formed on the base film; and an organic light emitting material layer formed on the photothermal conversion layer, wherein the photothermal conversion layer includes a tungsten oxide-based material and has a visible light transmittance of 20% or more.

Advantageous Effects

According to the present invention, the photothermal conversion film includes the tungsten oxide-based material and thus exhibits a high photothermal conversion effect and a visible light transmittance of 20% or more.

Therefore, there is an advantage in that the transfer film for OLEDs using the photothermal conversion film according to the present invention can be easily aligned with a substrate provided as a transfer target of an organic light emitting material due to excellent visible light transmittance of the photothermal conversion film, as compared with typical transfer films for OLEDs using carbon black.

BEST MODE

The above and other aspects, features, and advantages of the present invention will become apparent from the detailed description of the following embodiments in conjunction with the accompanying drawings. However, it should be understood that the present invention is not limited to the following embodiments and may be embodied in different ways, and that the embodiments are provided for complete disclosure and thorough understanding of the invention by those skilled in the art. The scope of the invention should be defined only by the accompanying claims and equivalents thereof.

Hereinafter, embodiments of the present invention will be described in detail with reference to the accompanying drawings.

Figure 1:
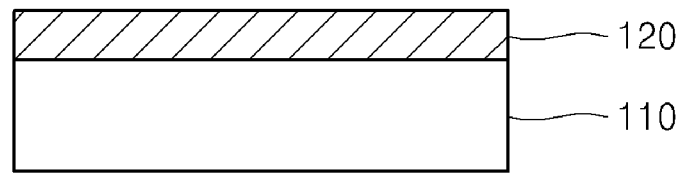
FIG. 1 is a schematic sectional view of a photothermal conversion film according to one embodiment of the present invention.

FIG. 1 is a schematic sectional view of a photothermal conversion film according to one embodiment of the present invention.

Referring to FIG. 1, the photothermal conversion film according to one embodiment of the invention includes a base film 110 and a photothermal conversion layer 120.

The base film 110 may include polymer films of various materials, such as polyethylene (PE), polyethylene terephthalate (PET), polypropylene (PP), poly(methyl methacrylate) (PMMA), polyvinyl chloride (PVC), polycarbonate (PC), polystyrene (PS), and the like. Preferably, the base film 110 is a PET film. There is a merit in that the PET film facilitates shape maintenance through prevention of deformation due to high light transmittance thereof upon light irradiation for photothermal conversion.

The photothermal conversion layer 120 is formed on the base film 110. The photothermal conversion layer 120 absorbs light and thus emits heat. The photothermal conversion layer 120 expands in a film thickness direction while emitting heat. Here, when an organic light emitting material layer is formed on an upper side of the photothermal conversion layer, adhesion between the photothermal conversion layer and the organic light emitting material layer is weakened due to expansion of the photothermal conversion layer upon photothermal conversion, thereby enabling transfer to a transfer target such as a substrate.

According to the present invention, the photothermal conversion film includes a tungsten oxide-based material as a material for photothermal conversion.

The tungsten oxide-based material exhibits excellent infrared absorptivity and thus allows excellent photothermal conversion upon laser irradiation.

Typically, carbon black is used as a material used for the photothermal conversion layer. Carbon black has an excellent capability of absorbing laser light and emitting heat, and thus is widely used in transfer using photothermal conversion. However, since carbon black exhibits extremely low visible light transmittance, a photothermal conversion film using carbon black exhibits almost no transparency. Thus, in transfer through photothermal conversion, there is a problem in that the photothermal conversion film using carbon black is not easily aligned with the transfer target. Of course, although the photothermal conversion film can obtain a certain degree of light transmittance if a small amount of carbon black is included, the film still exhibits insufficient photothermal conversion.

In addition, the material used for the photothermal conversion layer may include dyes. The dyes can absorb only light at a specific wavelength despite excellent visible light transmittance thereof.

However, according to the present invention, since the photothermal conversion film employs the tungsten oxide-based material, the film can provide higher photothermal conversion than those using carbon black. In particular, since the photothermal conversion film using the tungsten oxide-based material has an extremely good visible light transmittance of 20% or more, typical alignment problem in transfer can be resolved.

The tungsten oxide-based material may include tungsten oxide powder such as $WO_{2.72}$ and the like.

In addition, the tungsten oxide-based material may include hydrogen or metal-containing tungsten oxide ($M_xWO_3$, where M is hydrogen or a metal, 0.1<x<1) powder. The metal may include at least one selected from among Li, Na, K, Rb, Cs, Ca, Ba, Sr, Fe, Sn, Mo, Nb, Ta, Ni, Pd, Pt, Cu, Ag, Au, Zn, Cd, Al, Ga, In, and Tl. Examples of metal-containing tungsten oxide may include $K_{0.33}WO_3$, $Rb_{0.33}WO_3$, $Cs_{0.33}WO_3$, and the like. Preferably, metal-containing tungsten oxide is cesium (Cs)-containing $Cs_{0.33}WO_3$ in terms of photothermal conversion efficiency and light transmittance.

The photothermal conversion layer including the tungsten oxide-based material may be formed by coating a composition including the tungsten oxide-based material, a binder, a photoinitiator and a solvent, followed by drying. Among these components, since the solvent is removed, the photothermal conversion layer may finally include the tungsten oxide-based material, the binder, and the photoinitiator.

The binder may be any binder known in the art, such as acrylates, urethane acrylates, epoxy acrylates and the like, so long as the binder can be subjected to photopolymerization. The binder may be present in an amount of 10 parts by weight to 50 parts by weight, based on 100 parts by weight of the tungsten oxide-based material. If the amount of the binder is less than 10 parts by weight, the binder can have an insufficient effect on the composition. If the amount of the binder is greater than 50 parts by weight, the composition can exhibit somewhat deteriorated photothermal conversion efficiency.

The photoinitiator may be any photoinitiator, such as Irgacure 651. The photoinitiator may be present in an amount of 0.1 parts by weight to 5 parts by weight, based on 100 parts by weight of the tungsten oxide-based material. If the amount of the photoinitiator is less than 0.1 parts by weight, photopolymerization of the binder may be delayed. If the amount of the photoinitiator is greater than 5 parts by weight, the composition can suffer from deterioration in liquid stability.

The solvent may include organic solvents known in the art. These organic solvents may be used alone or in combination thereof. The solvent may be used such that the composition has a viscosity from about 10 cPs to about 100 cPs for easy coating, without being limited thereto.

The photothermal conversion layer may have a thickness of 1 μm to 5 μm. If the thickness of the photothermal conversion layer is less than 1 μm, the photothermal conversion layer cannot expand to a sufficient thickness, which is required for transfer, in a thickness direction upon light irradiation. If the thickness of the photothermal conversion layer is greater than 5 μm, the thickness of the layer is simply increased without additional effects.

Figure 2:
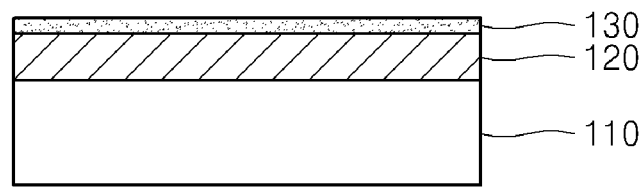
FIG. 2 is a schematic sectional view of a photothermal conversion film according to another embodiment of the present invention.

FIG. 2 is a schematic sectional view of a photothermal conversion film according to another embodiment of the present invention.

Referring to FIG. 2, the illustrated photothermal conversion film includes a base film 110, a photothermal conversion layer 120, and a protective layer 130.

The protective layer 130 may include acrylic resins exhibiting excellent adhesion to the photothermal conversion layer 120, and the like.

When the protective layer 130 is formed, the protective layer may have a thickness of 0.1 μm to 3 μm. If the thickness of the protective layer is less than 0.1 μm, the protective layer can provide an insufficient effect of protecting the photothermal conversion layer 120. If the thickness of the protective layer is greater than 3 μm, adhesion of a transfer material to the protective layer cannot be weakened despite expansion of the photothermal conversion layer upon light irradiation.

Figure 3:
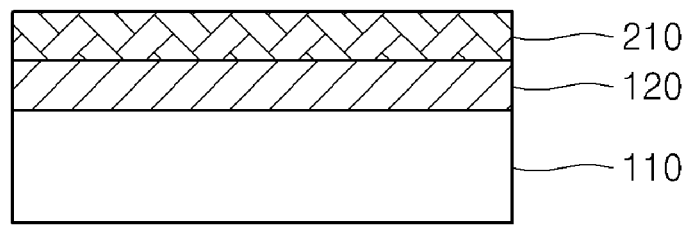
FIG. 3 is a schematic sectional view of a transfer film for OLEDs according to one embodiment of the present invention.

FIG. 3 is a schematic sectional view of a transfer film for OLEDs according to one embodiment of the present invention.

Referring to FIG. 3, the transfer film for OLEDs includes a base film 110, a photothermal conversion layer 120, and an organic light emitting material layer 210.

The transfer film for OLEDs shown in FIG. 3 further includes the organic light emitting material layer 210 formed on the photothermal conversion film shown in FIG. 1.

For example, upon light irradiation using a laser, since the photothermal conversion film expands in the thickness direction while the tungsten oxide-based material included in the photothermal conversion layer 120 absorbs infrared light and emits heat, the organic light emitting material layer 210 can be transferred to a substrate provided as a transfer target when peeled off.

Figure 4:
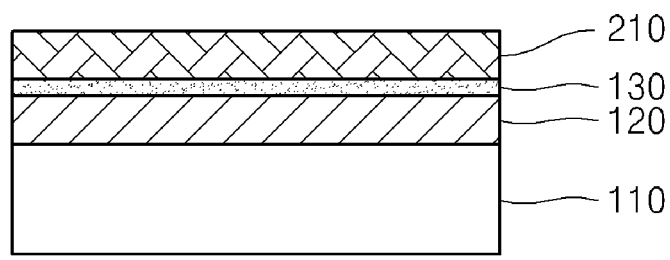
FIG. 4 is a schematic sectional view of a transfer film for OLEDs according to another embodiment of the present invention.

FIG. 4 is a schematic sectional view of a transfer film for OLEDs according to another embodiment of the present invention.

Referring to FIG. 4, the transfer film for OLEDs includes a base film 110, a photothermal conversion layer 120, a protective layer 130, and an organic light emitting material layer 210.

Since the example transfer film shown in FIG. 4 is the same as that shown in FIG. 3 except that the photothermal conversion layer 120 is protected by the protective layer 130, detailed descriptions thereof will be omitted.

EXAMPLES

Hereinafter, the present invention will be described in more detail with reference to some examples. It should be understood that these examples are provided for illustration only and are not to be construed in any way as limiting the present invention.

A description of details apparent to those skilled in the art will be omitted for clarity.

1. Preparation of Specimen

3 μm thick photothermal conversion layers including photothermal conversion materials as listed in Table 1 were formed on 100 μm thick PET films, respectively. In each example, urethane acrylate (20 parts by weight based on the photothermal conversion material) was used as a binder, and Irgacure 651 (BASF Co., Ltd., 0.5 parts by weight based on the photothermal conversion material) was used as a photoinitiator. Isopropyl alcohol was used as a solvent, and a composition, which was made of the photothermal conversion material, the binder, the photoinitiator and the solvent, had a viscosity of 20 cPs.

TABLE 1

|  | Photothermal conversion material | Visible light transmittance (%) | Photothermal conversion efficiency (%) |
|---|---|---|---|
| Example 1 | $WO_{2.72}$ | 50 | 200 |
| Example 2 | $Cs_{0.33}WO_3$ | 50 | 220 |
| Comparative Example 1 | Carbon black | 0 | 200 |
| Comparative Example 2 | Dye | 70 | 160 |

In Table 1, the photothermal conversion efficiency was evaluated as a degree of expansion relative to an initial thickness when the backside of the PET film was irradiated with a laser beam at 50 W and at 1.0 m/min.

2. Result of Property Evaluation

Referring to Table 1, the photothermal conversion films prepared in Examples 1 to 2 exhibited photothermal conversion efficiency equal to or higher than that of the photothermal conversion film prepared in Comparative Example 1, which was prepared using carbon black. In particular, the photothermal conversion films of Examples 1 to 2 exhibited a significantly high visible light transmittance of 50%.

On the other hand, the photothermal conversion film of Comparative Example 2, which was prepared using dyes, exhibited relatively low photothermal conversion efficiency, irrespective of high visible light transmittance.

Although the present invention has been described with reference to some embodiments, it should be understood that the foregoing embodiments are provided for illustrative purposes only, and that various modifications, changes, alterations, and equivalent embodiments can be made by those skilled in the art without departing from the spirit and scope of the invention. Therefore, the scope of the invention should be limited only by the accompanying claims and equivalents thereof.

LIST OF REFERENCE NUMERALS

110: Base film
120: Photothermal conversion layer
130: Protective layer
210: Organic light emitting material layer

The invention claimed is:

1. A photothermal conversion film comprising:
a base film; and
a photothermal conversion layer formed on the base film,
wherein the photothermal conversion layer comprises a tungsten oxide-based material and has a visible light transmittance of 20% or more, and
wherein the photothermal conversion layer comprises 0.1 parts by weight to 5 parts by weight of a photoinitiator, based on 100 parts by weight of the tungsten oxide-based material.

2. The photothermal conversion film according to claim 1, wherein the tungsten oxide-based material comprises tungsten oxide powder.

3. The photothermal conversion film according to claim 1, wherein the tungsten oxide-based material comprises hydrogen or metal-containing tungsten oxide powder ($M_xWO_3$, M being hydrogen or metal, $0.1<x<1$).

4. The photothermal conversion film according to claim 3, wherein the metal comprises at least one selected from among Li, Na, K, Rb, Cs, Ca, Ba, Sr, Fe, Sn, Mo, Nb, Ta, Ni, Pd, Pt, Cu, Ag, Au, Zn, Cd, Al, Ga, In, and Tl.

5. The photothermal conversion film according to claim 1, wherein the photothermal conversion layer comprises 10 parts by weight to 50 parts by weight of a binder.

6. The photothermal conversion film according to claim 1, wherein the photothermal conversion layer has a thickness of 1 μm to 5μm.

7. The photothermal conversion film according to claim 1, further comprising: a protective layer formed on the photothermal conversion layer.

8. The photothermal conversion film according to claim 7, wherein the protective layer has a thickness of 0.1 μm to 3 μm.

9. A transfer film for OLEDs, comprising:
a base film;
a photothermal conversion layer formed on the base film; and
an organic light emitting material layer formed on the photothermal conversion layer,
wherein the photothermal conversion layer comprises a tungsten oxide-based material and has a visible light transmittance of 20% or more, and wherein the photothermal conversion layer comprises 0.1 parts by weight to 5 parts by weight of a photoinitiator, based on 100 parts by weight of the tungsten oxide-based material.

10. The transfer film according to claim 9, wherein the tungsten oxide-based material comprises tungsten oxide powder.

11. The transfer film according to claim 9, wherein the tungsten oxide-based material comprises hydrogen or metal-containing tungsten oxide powder ($M_xWO_3$, M being hydrogen or metal, $0.1<x<1$).

12. The transfer film according to claim 11 wherein the metal comprises at least one selected from among Li, Na, K, Rb, Cs, Ca, Ba, Sr, Fe, Sn, Mo, Nb, Ta, Ni, Pd, Pt, Cu, Ag, Au, Zn, Cd, Al, Ga, In, and Tl.

13. The transfer film according to claim 9, wherein the photothermal conversion layer comprises 10 parts by weight to 50 parts by weight of a binder.

14. The transfer film according to claim 9, wherein the photothermal conversion layer has a thickness of 1 μm to 5 μm.

15. The transfer film according to claim 9, further comprising: a protective layer formed on the photothermal conversion layer,
wherein the organic light emitting material layer is formed on the protective layer.

16. The transfer film according to claim 15, wherein the protective layer has a thickness of 0.1 μm to 3 μm.

* * * * *